United States Patent [19]

Ebe et al.

[11] Patent Number: 5,496,772
[45] Date of Patent: Mar. 5, 1996

[54] METHOD OF MANUFACTURING FILM CARRIER TYPE SUBSTRATE

[75] Inventors: Akinori Ebe; Kiyoshi Ogata; Satoshi Nishiyama, all of Kyoto, Japan

[73] Assignee: Nissin Electric Co., Ltd., Kyoto, Japan

[21] Appl. No.: 892,380

[22] Filed: Jun. 4, 1992

[30] Foreign Application Priority Data

Apr. 7, 1992 [JP] Japan .................................... 4-085757
Apr. 7, 1992 [JP] Japan .................................... 4-085759

[51] Int. Cl.$^6$ .................................................. H01L 21/44
[52] U.S. Cl. ........................................ 437/187; 437/245
[58] Field of Search .................................... 437/228, 187, 437/245; 156/667, 659.1; 204/192.14, 192.3

[56] References Cited

U.S. PATENT DOCUMENTS 4,886,681 12/1989 Clabes et al. ...................... 204/192.14

OTHER PUBLICATIONS

"Metal/Polyimide Adhesion Improvement by Metal Deposition with Ion Bombardment," IBM Technical Disclosure Bulletin, vol. 32, No. 2, Jul. 1989, p. 261.

"Super–Adhesive Bonding of Metal to Polyimide," IBM Technical Disclosure Bulletin, vol. 30, No. 7, Dec. 1987, pp. 227–228.

"Handbook of Thin Film Technology," L. I. Maissel et al., McGraw–Hill, 1970, pp. 7–1, 7–3, 7–24.

"Interface Toughening by Ion Implantation for Enhancement of Thin Film Adhesion," IBM Technical Disclosure Bulletin, vol. 33, No. 1B, Jun. 1990, pp. 69–71.

*Primary Examiner*—R. Bruce Breneman
*Attorney, Agent, or Firm*—Finnegan, Henderson, Farabow, Garrett & Dunner

[57] ABSTRACT

A film carrier type substrate includes a film made of organic high molecular substance, a metal layer formed over the film by depositing metal vapor and irradiating nitrogen gas ions on the film and a mixing layer made of a mixture of the materials of both the metal layer and the film formed in the interface between the metal layer and the film. Prior to forming the metal layer, inert gas ions and/or nitrogen gas ions may be irradiated on the film in advance.

2 Claims, 1 Drawing Sheet

METHOD OF MANUFACTURING FILM CARRIER TYPE SUBSTRATE

BACKGROUND OF THE INVENTION

The present invention relates to a film carrier type substrate used, for example, for high density mounting of integrated circuits, which is based on the film carrier system, and to a method of manufacturing the film carrier type substrate.

The film carrier system among (IC) integrated circuits mounting techniques has attracted a special attention because of its advantageous features of a continuous IC mounting process and high bonding speed.

The film carrier type substrate used for the film carrier system is conventionally categorized into two types of substrates. (1) The first type of substrate is shown in FIG. 1. As shown, a copper foil 13 is bonded onto a film 11 by means of adhesion 12. The copper foil 13 thus bonded is etched to form a pattern of a desired electric circuit. (2) In the second type of substrate, an electric pattern made of copper, nickel or the like is formed on the surface of the film 11 by non-electrolytic plating process. In either type of substrate, the film 11 is made of an organic high molecular substance, mainly polyimide.

The substrate with a copper foil bonded thereto, involves the following disadvantages. (1) Since the adhesion layer 12 is interlayered between the film 11 and copper foil 13, poor thermal conductivity is present between them. (2) The adhesiveness between the film 11 of polyimide or the like and the copper foil 13 is unsatisfactory. (3) When the film carrier type substrate undergoes temperature of 150° or more for a long time, the bonding of the film 11 and the copper foil 13 is remarkably deteriorated.

The substrate formed by the non-electrolytic plating process as wet process is disadvantageous in that (1) adhesion properties of the plating layer is not uniform, and (2) a strict management is required for plating solution to avoid environmental pollution.

SUMMARY OF THE INVENTION

Accordingly, an object of the present invention is to provide a film carrier type substrate which succeeds in solving the problems of the conventional one, and a method of manufacturing the same.

A film carrier type substrate of the present invention comprises a film made of organic high molecular substance, a metal layer formed over the film, and a mixing layer formed in the interface of the film and the metal layer, the mixing layer made of a mixture of the materials of both the film and the metal layer.

In a first method of manufacturing a film carrier type substrate according to a first aspect of the present invention, in vacuum, metal vapor is deposited on a film made of organic high molecular substance and accelerated nitrogen gas ions are irradiated on the film, whereby a metal layer is formed over the film and a mixing layer made of a mixture of the materials of both the metal layer and the film is formed in the interface between the metal layer and the film.

In a second method of manufacturing a film carrier type substrate according to a second aspect of the present invention, in vacuum, inert gas ions and/or nitrogen gas ions are irradiated on a film made of organic high molecular substance. Then, metal vapor is deposited on the film, and accelerated inert gas ions and/or accelerated nitrogen gas ions are irradiated on the film. Consequently, a metal layer is formed over the film and a mixing layer made of a mixture of the materials of both the metal layer and the film is formed in the interface between the metal layer and the film.

The film carrier type substrate of the invention, as a metal layer is formed over a film made of organic high molecular substance, is satisfactorily flexible. Further, since the mixing layer functions like a coupling member, an adhesive force of the metal layer to the film is strong. Accordingly, the metal layer hardly peels off the film. Further, the thermal conduction between the film and the metal layer is good since no adhesive is placed between the film and the metal layer.

When the first manufacturing method of the invention is used, the film carrier type substrate can be manufactured by dry process in an easy and low-cost manner. The quality of the resultant products is uniform. Further, the control of the thickness of the metal layer and the mixing layer is easy, and the patterning of the metal layer is easy.

When the second manufacturing method of the invention is used, the same effects as those obtained in the first method are obtained. Further, the first film surface exposure to the gas ions forms an amorphous carbon layer on the film surface, and sputters subsurface oxygen on the film surface, which is supposed to cause the adhesiveness of the mixing layer to be reduced when environment (here, time elapse, heat cycle, etc.) changes or when the substrate is immersed in etching solution of hydrochloride acid series. That is, the surface exposure to the gas ions remarkably reduces the amount of oxygen on the film surface. Accordingly, the mixing layer formed on the film surface contains a less amount of oxygen, and the metal layer is intimately layered on the mixing layer.

DETAILED DESCRIPTION OF THE PREFERRED EMBODIMENT

Figure 1:
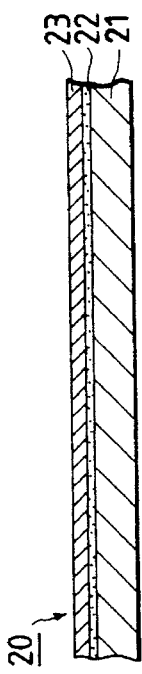
FIG. 1 is an enlarged, partial cross sectional view showing a conventional film carrier type substrate.
Figure 2:
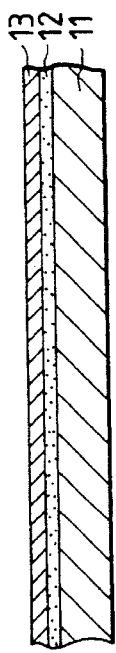
FIG. 2 is an enlarged, partial cross sectional view showing a film carrier type substrate according to the present invention.

FIG. 2 is an enlarged, partial cross sectional view showing an example of a film carrier type substrate according to the present invention. In the film carrier type substrate 20, a metal layer 23 of high electric conductivity, which is made of any of materials such as Au, Ag, Cu, Ni, and Al, is formed on a film 21 made of organic high molecular substance, for example, polyimide. A mixing layer 22 is formed in the interface of the film 21 and the metal layer 23. The mixing layer is made of a mixture of the materials of both the film and the metal layer, i.e., organic high molecular substance and the metal.

The metal layer 23 may be formed over the entire surface of the film 21 or may be formed on the surface of the film 21 in the form of an electric circuit pattern.

The thickness of the metal layer 23 is preferably within the range of 0.1 μm to 50 μm. Selection of the thickness range is based on the facts that the thickness of less than 0.1 μm will provide insufficient electric conductivity, and the thickness of more than 50 μm will provide poor flexibility of the film 21 and increase the cost to manufacture.

The thickness of the mixing layer 22 is preferably within the range of approximately 5 nm to 500 nm. The thickness of such a range will provide satisfactory adhesion properties. When the thickness is selected to be in excess of the upper value of the range, the film 21 will lose its flexibility.

The features of the film carrier type substrate 20 thus constructed are listed below.

(1) The flexibility of the substrate is satisfactory, or at least equivalent to that of the previously described substrate. This is due to the fact that the metal layer 23 is adhesively formed on the film 21 made of organic high molecular substance.

(2) Since the mixing layer 22 functions like a coupling member, the adhesiveness of the metal layer 23 to the film 21 is high. Accordingly, the metal layer highly resists peeling off the film.

(3) No adhesion is present between the film 21 and the metal layer 23, and the compositions continuously vary in the interface between the film 21 and the metal layer 23 due to the mixing layer 22. Therefore, thermal conductivity is excellent between the film 21 and the metal layer 23.

Figure 3:
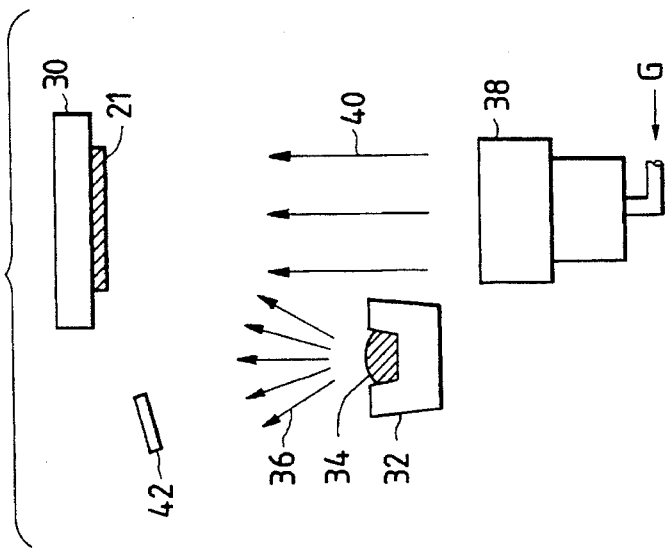
FIG. 3 is a schematic diagram showing an apparatus for executing the method of manufacturing a film carrier type substrate according to the present invention.

A first method of manufacturing the film carrier type substrate 20 according to the present invention will be described with reference to FIG. 3. FIG. 3 is a schematic view showing an example of an apparatus for executing the substrate manufacturing method of the invention.

A film 21 as described before is mounted on a holder 30 and is placed in a vacuum chamber (not shown). A vapor source 32 and an ion source 38 are disposed to be directed toward the film 21. The vapor source 32, such as an electron beam vapor source, heats metallic material 34 to evaporate it, and deposits metal vapor 36 on the film 21. The ion source 38, preferably a bucket type ion source, ionizes nitrogen gas G supplied thereinto and accelerates nitrogen ions, which are distributed uniformly over a large area, toward the film 21. The ion source is capable of processing a large area at one time. Reference numeral 42 designates a film thickness monitor for monitoring the thickness of a thin film formed over the film 21.

The metal vapor 36 may be vapor of any of high electrical conductivity, such as Au, Ag, Cu, Ni, and Al.

In the process of manufacturing the film carrier type substrate, the vacuum chamber is evacuated up to approximately $10^{-5}$ to $10^{-7}$ Torr. Subsequently, metal vapor 36 from the vapor source 32 is deposited on the film 21, and, at the same time or alternately, accelerated nitrogen gas ions 40 supplied from the ion source 38 are irradiated toward the film 21. At this time, if required, cooling medium such as cooling water may be supplied to the holder 30 thereby to cool the film 21.

A plurality of vapor sources 32 and a plurality of ion sources 38 may be used when the area of the film 21 to be processed is large.

Through the above process, the metal layer 23 as described above is formed on a film 21. Further, through the knock-on action of the ions 40, the mixing layer 22 as described above is formed in the interface of the film 21 and the metal layer 23. As a result, the film carrier type substrate 20 as shown in FIG. 2 is manufactured.

The metal layer 23 can be easily adjusted to a desired thickness, for example, 0.1 μm to 50 μm, by using the film thick monitor 42, for example.

The thickness of the mixing layer 22 depends on the acceleration energy (or average projection distance) of the ions 40 and a dosage of the irradiated ions. An excessive thickness of the mixing layer 22 (resulting from excessive increase of acceleration energy of ions 40 and/or dosage of irradiated ions) will create some problems. For example, as the substrate is deteriorated with irradiation of ions, the film loses its flexibility, and the cost of the apparatus is increased. Also, the thickness of the mixing layer 23 between 5 nm and 500 nm is sufficient in view of adhesion of the mixing layer 23. Accordingly, the acceleration energy of ions 40 is approximately between 500 eV and 10 KeV, preferably 20 KeV or less. The dosage of irradiated ions are selected to be within the range from $1.0 \times 10^{14}$ to $1.0 \times 10^{18}$ ions/cm$^2$.

The vapor deposition and ion irradiation may be carried out through a mask with a predetermined pattern. If done in this manner, a patterned metal layer 23 as an electric circuit is formed on the film 21 without any additional step. Alternately, an electric circuit pattern may be formed in a manner that the metal layer 23 is formed over the film 21 as in the previous manner, and then the formed metal layer is etched to form a desired electric circuit pattern by conventional etching process.

Following are advantageous features of the substrate manufacturing method of the invention:

(1) The film carrier type substrate 20 having features as stated above can be manufactured by dry process and in easy and inexpensive manner. The products manufactured have uniform product quality.

(2) Adjustment of the thickness of the metal layer 23 and the mixing layer 22 is easy. Accordingly, it is easy to manufacture the film carrier type substrate 20 with excellent characteristics in accordance with required usage.

(3) The substrate surface has good smoothness. The resultant film carrier type substrate 20 exhibits good adhesive properties against IC chips, for example, and good thermal conductivity.

(4) The metal layer 23 may be patterned in the process of forming the metal layer, without any additional patterning process.

EXAMPLE 1

An apparatus as shown in FIG. 3 was used. Cooling water was fed to the holder 30. A polyimide film of 0.15 mm thick was set to the holder 30. Metallic evaporated material 34 of the vapor source 32 was oxygen-free copper. It was heated with electron beams to evaporate. Vapor of oxygen-free copper was deposited over the film. At the same time, nitrogen gas ions from the ion source 38 was accelerated with the energy of 5 KeV and was irradiated on the film. At this time, the current density on the holder 30 was 16.7 μA/cm$^2$. The rate of evaporating copper was 5.0 Å/sec. The process was continued for 100 seconds. A film carrier type substrate as stated above was manufactured.

A peeling test was conducted for evaluating an interface strength of the polyimide film and the copper deposited film thus formed. The results of the evaluation are shown in Table 1.

The evaluations of the substrate which experienced only the vacuum deposition, that is, did not experience the ion irradiation, and the substrate which underwent the IVD (Ion Vapor Deposition) process using Ar gas ions under the conditions similar to those of the case using nitrogen gas ions are additionally shown in the table, for comparison. As seen from the table, irradiation of nitrogen gas ions remarkably improves the adhesive properties, so that the films were broken while the copper layers were left sticking to the film and measurement could not be carried out.

TABLE 1

|  | Not treated | Ar ions (IVD) | N ions (IVD) |
| --- | --- | --- | --- |
| Peel strength | 0.2 (kg/cm) | 1.2 (kg/cm) | Film broken |

Figure 4:
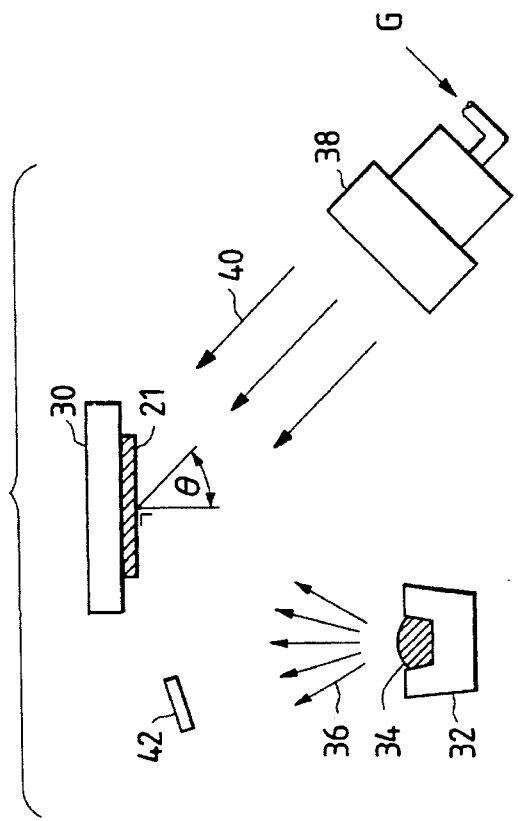
FIG. 4 is a schematic diagram showing a modification of an apparatus for executing the method of manufacturing a film carrier type substrate according to the present invention.

A second method of manufacturing the film carrier type substrate 20 according to the present invention will be described with reference to FIG. 4. FIG. 4 is a schematic view showing an example of an apparatus for executing the substrate manufacturing method of the invention which has the same construction as the apparatus shown in FIG. 3 except for the inclination θ of an ion source 38. The second method is substantially the same as the first method described before except that inert gas ions and/or nitrogen gas ions are irradiated on a film of organic high molecular substance in advance.

In the process of manufacturing the film carrier type substrate, the vacuum chamber is evacuated up to approximately $10^{-5}$ to $10^{-7}$ Torr. Subsequently, inert gas ions 40 are pulled out of the vapor source 38 and is irradiated on the film 21. The inert gas ions 40 may be gas ions of any of helium, neon, argon, krypton and the like. The accelerating energy of inert gas ions 40 is preferably 100 eV to 20 KeV. The dosage of inert gas ions is preferably $1.0 \times 10^{14}/cm^2$ or more. These values actually change depending on the kind of inert gas ions 40 and material of the substrate 21. Accordingly, the most suitable values are selected for the respective factors. The ion incident angle θ may be within the range from 0° to 90°; however, 45° is preferable when taking the efficiency of sputtering into account. Thereafter, similarly to the first method according to the present invention, simultaneously or alternately with depositing metal vapor 36 on the film 21, the accelerated nitrogen gas ions 40 supplied from the ion source 38 are irradiated toward the film 21. At this time, if required, cooling medium such as cooling water may be supplied to the holder 30 thereby to cool the film 21.

A plurality of vapor sources 32 and a plurality of ion sources 38 may be used when the area of a film 21 to be processed is large.

Through the above process, the metal layer 23 as described above is formed on the film 21. Further, through the knock-on action of the ions 40, the mixing layer 22 as described above is formed in the interface of the film 21 and the metal layer 23. As a result, the film carrier type substrate 20 as shown in FIG. 2 is manufactured, which are substantially the same as the substrate obtained by the first method. Also, the manufacturing conditions, features etc. of the second method are substantially the same as those of the first method.

EXAMPLE 2

An apparatus as shown in FIG. 4 was used. Cooling water was fed to the holder 30. A polyimide film of 0.15 mm thick was set to the holder 30. Argon ions of $6.0 \times 10^{16}/cm^2$ were irradiated onto the film surface, with acceleration energy of 2 KeV. The incident angle θ of argon ions was 45° C. to the film surface. Metallic evaporated material 34 of the vapor source 32 was oxygen-free copper. It was heated with electron beams to evaporate. Vapor of oxygen-free copper was deposited over the film. At the same time, argon gas ions from the ion source 38 was accelerated with the energy of 5 KeV and was irradiated on the film. At this time, the current density on the holder 30 was 16.7 μA/cm$^2$. The rate of evaporating copper was 5.0 Å/sec. The process was continued for 100 seconds. A film carrier type substrate as stated above was manufactured.

A peeling test was conducted for evaluating an interface strength of the polyimide film and the copper deposited film of the substrate thus formed. In the test to peel the deposited copper layer from the film, all the films were broken while the copper layers were left sticking to the film. For the flexibility of the films, no problem was found.

For comparison, the same test was conducted on the substrates in which copper was deposited on the film without any ion irradiation process. The copper deposited layer was easily peeled off the film. This was confirmed for all the substrates.

The results of the peeling test for the substrates one month after formation of these substrates are shown in Table 2. The test result of the substrate in which the mixing film was formed on the film surface without ion irradiation process in advance is contained in the table, for comparison.

As seen from the table, no deterioration of the adhesion properties with time is observed for the substrate subjected to the ion irradiation in advance.

TABLE 2

|  | No ion irradiation in advance to film | | Ion irradiation in advance to film | |
| --- | --- | --- | --- | --- |
|  | Immediately after manufacture | One month after manufacture | Immediately after manufacture | One month after manufacture |
| Peel strength (kg/cm) | 1.2 | 0.4 | 1.4 | 1.4 |

As described above, according to the present invention, a film carrier type substrate is sufficiently flexible, and has good adhesive properties of a metal layer against a film, and good thermal conductivity between the film and metal layer. Such an excellent film carrier type substrate can be manufactured by dry process and in easy and inexpensive manner. The resultant products are uniform in the product quality. The thickness adjustment of the metal layer and a mixing layer is easy, and the patterning of the metal layer is also easy. Further, especially according to the second method of the present invention, the adhesion properties of the mixing film is unsusceptive to the etching solution of hydrochloride acid series, time elapse, heat cycle, and the like, since a less amount of oxygen is contained in the mixing layer between the film and the metal layer.

What is claimed is:

1. A method of manufacturing a film carrier type substrate in vacuum, comprising the steps of:

depositing metal vapor on a file made of organic high molecular substance; and irradiating accelerated nitrogen gas ions on said film simultaneously with the step of depositing metal vapor, an accelerating energy x of which is defined by the range 2 KeV<x<10 KeV, whereby a metal layer is formed over said film and a mixing layer made of a mixture of materials of both said metal layer and said film is formed in an interface between said metal layer and said film.

2. A method of manufacturing a film carrier type substrate in vacuum, comprising the steps of:

irradiating accelerated ions of a gas selected from the group consisting of nitrogen and an inert gas on a film made of organic high molecular substance, wherein an accelerating energy x of said ions is defined by the range 2 KeV<x<10 KeV; and after the step of irradiating ions, conducting deposition of metal vapor on said film and irradiation of accelerated ions of said gas on said film simultaneously, whereby a metal layer is formed over said film and a mixing layer made of a mixture of materials of both said metal layer and said film is formed in an interface between said metal layer and said film.

* * * * *

UNITED STATES PATENT AND TRADEMARK OFFICE
CERTIFICATE OF CORRECTION

PATENT NO. : 5,496,772
DATED : March 05, 1996
INVENTOR(S) : Akinori EBE et al.

It is certified that error appears in the above-indentified patent and that said Letters Patent is hereby corrected as shown below:

CLAIM 1, COLUMN 6, LINE 61, "file" SHOULD READ --film--.

Signed and Sealed this

Sixteenth Day of July, 1996

BRUCE LEHMAN

Attest:

Attesting Officer    Commissioner of Patents and Trademarks